United States Patent [19]
Zimmerman

[11] 3,937,388
[45] Feb. 10, 1976

[54] METHOD FOR SEALING PACKAGES

[75] Inventor: Daniel D. Zimmerman, Silver Spring, Md.

[73] Assignee: The Johns Hopkins University, Baltimore, Md.

[22] Filed: May 24, 1973

[21] Appl. No.: 363,658

Related U.S. Application Data

[62] Division of Ser. No. 180,774, Sept. 15, 1971, Pat. No. 3,756,490.

[52] U.S. Cl. ............... 228/222; 228/46; 29/588; 156/498; 53/39
[51] Int. Cl.² ........................................ B23K 31/00
[58] Field of Search ........ 29/487, 588, 627; 219/85; 228/4, 5, 44, 46; 156/498, 583; 53/39

[56] References Cited
UNITED STATES PATENTS

| | | | |
|---|---|---|---|
| 2,289,618 | 7/1942 | Young | 219/85 X |
| 2,393,198 | 1/1946 | Somerville | 228/5 |
| 2,928,200 | 3/1960 | Kannergiesser et al. | 53/39 X |
| 3,102,182 | 8/1963 | Oelze et al. | 156/583 X |
| 3,382,342 | 5/1968 | Dix et al. | 53/39 X |
| 3,383,454 | 5/1968 | Dix | 228/44 X |
| 3,476,986 | 11/1969 | Tsuji | 29/589 X |
| 3,522,135 | 7/1970 | Page | 156/583 |
| 3,552,630 | 1/1971 | Dean | 228/46 |
| 3,583,063 | 6/1971 | Growney | 29/502 X |
| 3,683,146 | 8/1972 | Nugent et al. | 219/85 |

Primary Examiner—Ronald J. Shore
Attorney, Agent, or Firm—Robert E. Archibald; Kenneth E. Darnell

[57] ABSTRACT

A method and apparatus for sealing packages, e.g., microelectronics packages containing heat sensitive elements, by applying heat to melt solder on the peripheries thereof. At the same time heat is being applied to a package heat sinks are simultaneously engaged with the top and bottom portions thereof to carry off excess heat and thus protect the heat sensitive elements from damage.

3 Claims, 16 Drawing Figures

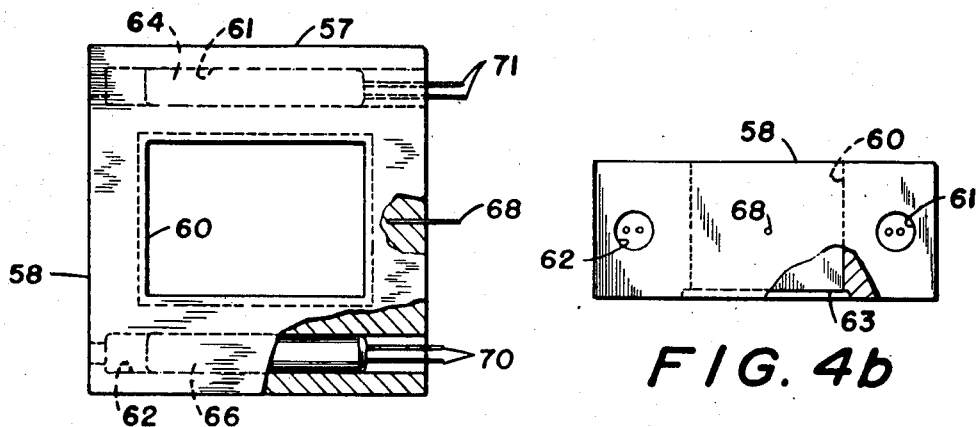
FIG. 4a
FIG. 4b
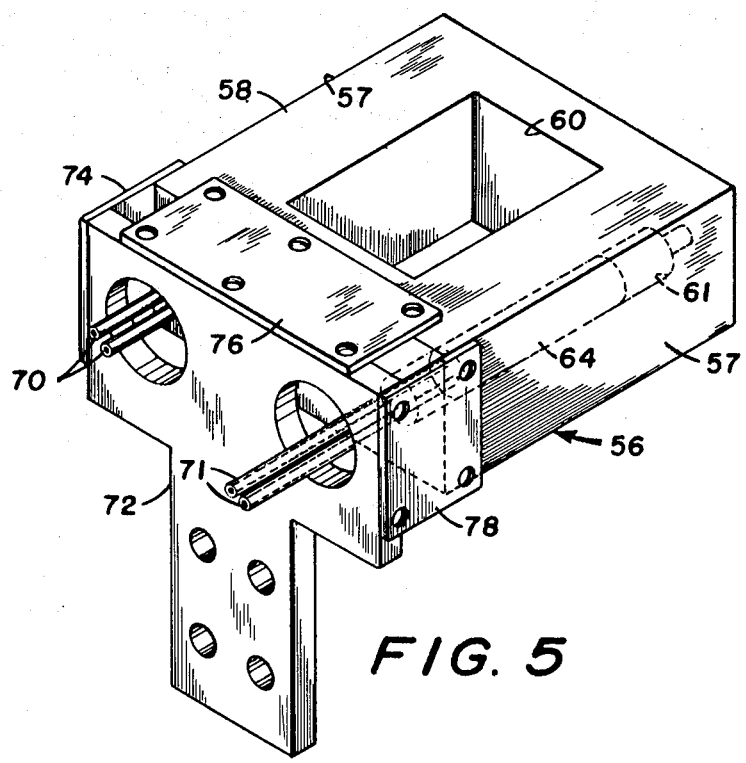
FIG. 5

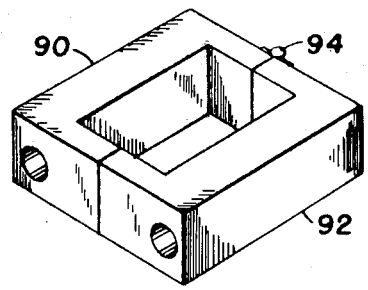
FIG. 7a
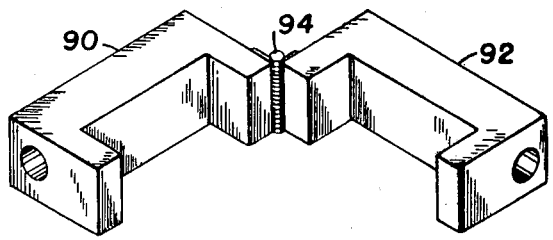
FIG. 7b
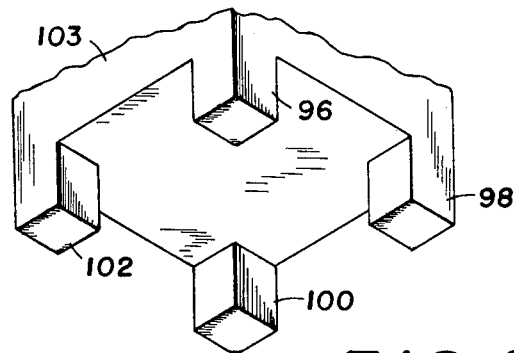
FIG. 8
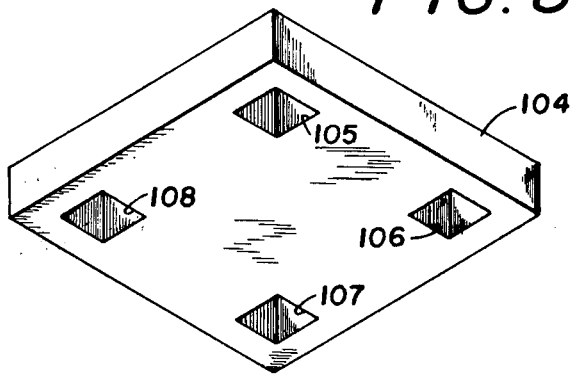

3,937,388

METHOD FOR SEALING PACKAGES

STATEMENT OF GOVERNMENT INTEREST

The invention herein described was made in the course of or under a contract or subcontract thereunder, with the Department of the Navy.

This is a division of application Ser. No. 180,774, filed Sept. 15, 1971, now U.S. Pat. No. 3,756,490.

BACKGROUND OF THE INVENTION

This invention relates to a method and apparatus for quickly, accurately and economically sealing packages which contain heat sensitive elements, e.g., microelectronic hybrid circuits. More specifically, the present invention accomplishes this function by the application of heat to the rim of the lid of the microelectronic package.

Hybrid circuits designed for high reliability are usually enclosed in a package which can be hermetically sealed in an inert atmosphere. A great variety of package sizes and shapes are utilized for use in microelectronic applications. Usually the three basic methods for sealing these packages are either furnace brazing, weld sealing, or hand solder sealing. The last method has been used mostly on larger size packages with one dimension of the package being about 1 inch or more. Expensive sealing systems are available from several commercial sources. These sealing systems are particularly designed for sealing popular sizes of flat packs but are incapable of sealing deep rectangular packages having protruding edges. Hand soldering has been widely used on larger packages and packages having protruding edges because it provides immediate sealing capability, maximum flexibility, and minimum cost in capital equipment. However, it is widely considered to be a time-consuming, unreliable method.

The technical requirements for a good package seal are proper mating of the parts at the seal surface area, an even flow of solder on the entire seal area, clean solder-wettable surfaces, and application of an adequate amount of heat simultaneously to the entire solder area without overheating the hybrid substrate and the parts mounted on it.

SUMMARY OF THE INVENTION

Initially, the base platform of the package to be sealed is placed on a lower heat sink mount. On the periphery of the lid of the package is a thin coating of solder or other binding material which when heated and subsequently cooled will bind the base platform to said lid. With the package securely placed on the lower heat sink mount, a heater core, mounted on a shaft for vertical and swinging movement, is shifted to a position whereby it is directly above the package. Within the heater core is an aperture which allows said core when lowered to surround the package and engage the rim thereof. After heat has been applied to the package for a short time, an upper heat sink is lowered through the aperture so that it rests directly upon the lid of the heated package, thereby providing the necessary heat protection for the package and any heat-sensitive contents therein. When heat has been applied to the microelectronic package for a time sufficient to melt the solder, the heating element is removed so that only the heat sinks remain in physical contact with the package. After the melted solder has hardened and sealed the package, the upper heat sink is also removed and the package can be demounted from the lower heat sink. Another package may then be placed on the lower heat sink mount and the above process can be repeated.

It is therefore an object of the present invention to provide a method and apparatus for quickly, accurately and economically sealing microelectronics packages containing heat sensitive elements.

It is another object of the invention to provide a method and apparatus that can simultaneously apply heating and heat sink elements to the lid of a microelectronics package.

It is still another object of the subject invention to provide a method and apparatus that can apply heat sink elements to the top and bottom portions of a microelectronics package while simultaneously and peripherally applying a heating element thereto.

It is still another object of the present invention to provide a method and apparatus that can seal various size microelectronics packages, including packages having protruding edges.

It is another object of the invention to provide a method and apparatus that can continuously apply the heat sink elements to the microelectronics package being sealed after the removal of the heating element from engagement therewith.

Another object of the present invention is to provide a method and apparatus for sealing microelectronics packages that employs a heating element which envelops the package lid while only being in physical contact with the rim of said package.

Another object of the invention is to provide a method and apparatus for the purpose set forth which can be used for removing the lid from a previously sealed package without subjecting delicate contents of the package to either mechanical or thermal damage.

Further objects and many of the attendant advantages of this invention will be readily appreciated as the same becomes better understood by reference to the following detailed description when considered in connection with the accompanying drawings.

BRIEF DESCRIPTION OF THE DRAWINGS

FIGS. 4a and 4b are plan views, partly in section, showing the heater core;

FIG. 5 is an enlarged detail perspective showing the entire heater assembly;

FIGS. 7a and 7b are detail perspective views illustrating another embodiment of the heater core, and FIG. 8 is an exploded perspective showing still another embodiment of the heater core.

DESCRIPTION OF THE PREFERRED EMBODIMENTS

The microelectronics package sealer of the present invention includes upper and lower heat sinks, a pedestal for mounting the lower heat sink, a heater core having an aperture therein for surrounding a package that is positioned upon said lower heat sink, heater element control means, first and second vertical bearing shafts, elevator and elevator control means for positioning said upper heat sink member, said elevator means having ball bushings for guiding said elevator down said first and second bearing shafts in such a manner so as to position said upper heat sink member upon the lid package.

Figure 1:
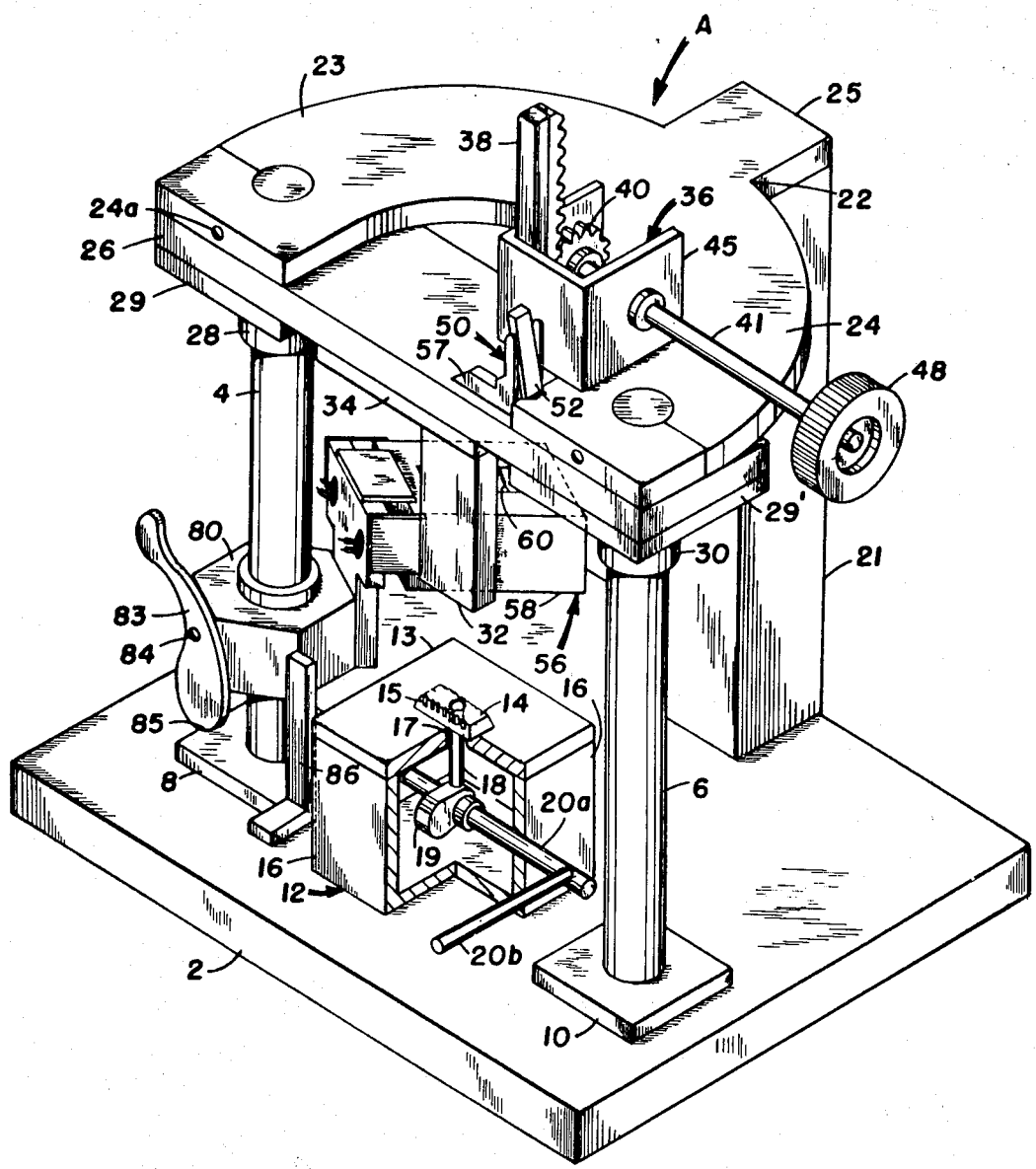
FIG. 1 is a perspective of the subject package sealer.
Figure 2:
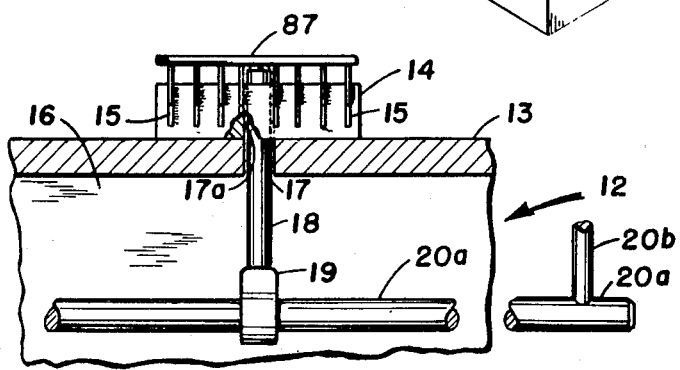
FIG. 2 is an enlarged detail section, partly in elevation, showing the lower heat sink employed and the mechanism for displacing a microelectronics package therefrom after a sealing operation.

Referring now to FIG. 1, there is shown one embodiment of the present invention. It is to be understood that neither the spirit nor the scope of the present invention is to be limited to the following embodiment, as said invention may be practiced other than as specifically described. Additionally, the package to be sealed will be referred to as a microelectronic package having a base platform substrate upon which is mounted microelectronic hybrid components and further having a lid which rests upon and is sealed on the base platform. Again, the scope of the present invention is not to be limited to the discussed package embodiments. The device of FIG. 1 comprises a base 2 to which are attached vertical bearing shafts 4 and 6 by foot plates 8 and 10, respectively. Centrally positioned upon the base 2 is a heat sink pedestal 12 which has a lower heat sink 14 centrally located on a top wall 13 thereof. The heat sink 14 is rectangular in shape and has a plurality of spaced vertical grooves 15 formed in opposite side walls thereof to receive connector pins of a package to be sealed. To assure firm engagement of the pins in the grooves 15, the walls of the grooves are inclined outwardly toward their lower ends. As is best seen in FIG. 2, the heat sink pedestal 12 is of rectangular shape and has, in addition to the top wall 13, side walls 16. A central opening 17 extends through the heat sink pedestal 12 and aligns with an opening 17a in the heat sink 14. An actuating rod 18 is positioned with its upper end portion mounted for vertical sliding movement in the openings 17 and 17a, the lower end of the rod 18 being engageable with a cam 19 on a shaft 20a which is journalled by the side walls 16 for rocking movement in the pedestal 12. Near its outer end, the shaft 20a is provided with a lever 20b for manual engagement. As is shown in FIGS. 1 and 2, raising the lever 20b will raise the rod 18 and displace a microelectronics package from the heat sink 14 after completion of a sealing operation.

Mounted on the base plate 2 at the rear thereof is a standard 21 which provides a support for a yoke 22, said yoke being generally semicircular and having legs 23 and 24 and a support tongue 25. As best seen in FIG. 1, the support tongue is formed integrally with the yoke and is secured to the upper end of the standard 21. The legs 23 and 24 are apertured near their outer ends to receive the upper end portions of the vertical bearing shafts 4 and 6, and are slit between said apertures and their side edges to permit slight enlargement of the apertures to receive said shafts. Screws 24a are passed through the slits to permit tightening of the yoke on said shafts.

As will now be understood, the shafts 4 and 6, the standard 21 and the yoke 22 cooperate to define a frame, indicated at A, for the upper heat sink, the heater and associated mechanism.

Mounted for vertical sliding movement on the shafts 4 and 6 of the frame A is a carriage 26. Sleeves 28 and 30 which are formed integrally with mounting plates 29 and 29' that are secured to the underside of the carriage, receive the shafts therethrough. Also mounted on the underside of the carriage 26, substantially centrally thereof, is an upper heat sink 32 which is of oblong rectangular shape and is of solid metal. The upper heat sink is secured to the carriage by a supporting plate 34. The upper heat sink 32 is so positioned on the carriage 26 that when said carriage is lowered, by mechanism to be described hereinafter, it will engage the lid of a microelectronics package on the lower heat sink 14.

Figure 3:
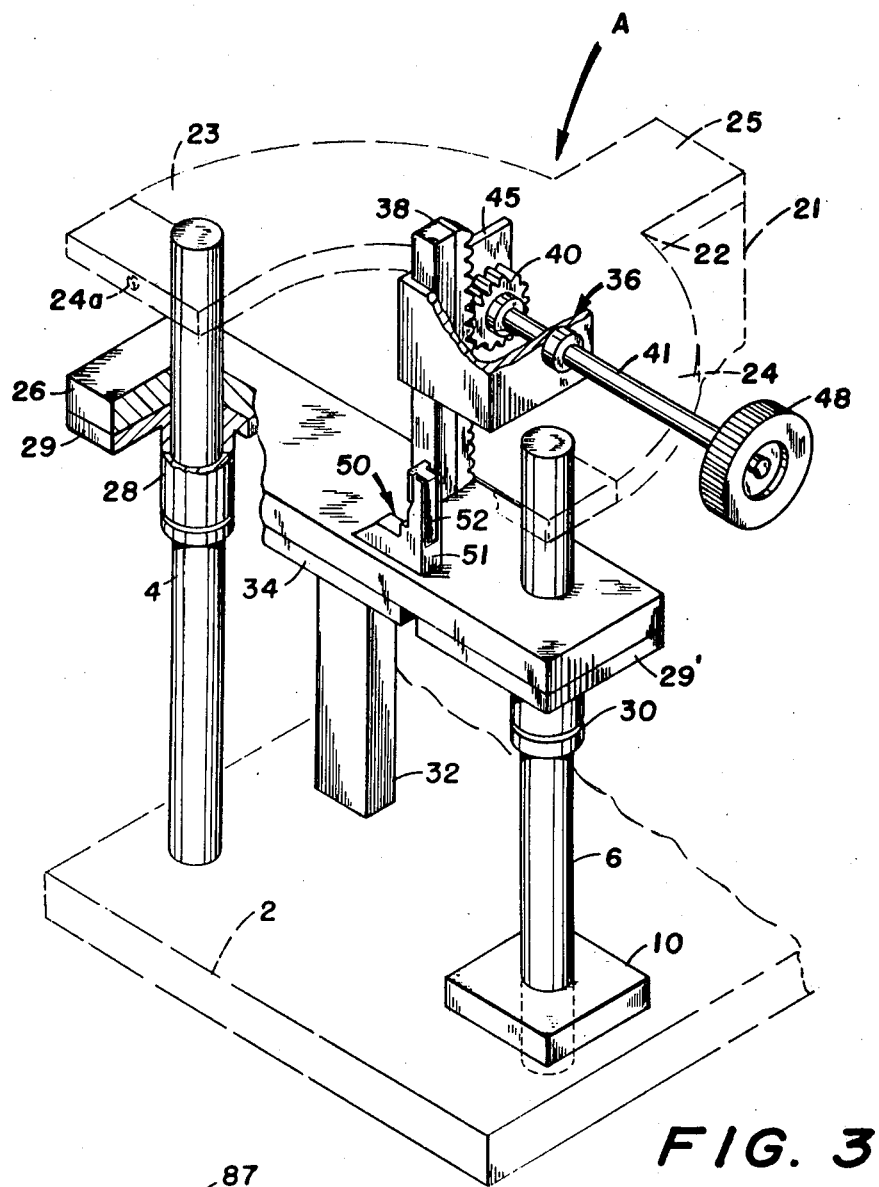
FIG. 3 is a detail perspective particularly showing the carriage control mechanism for the upper heat sink employed.

The control mechanism for the carriage 26 is shown generally at 36. As best seen in FIGS. 1 and 3, the control mechanism 36 includes a rack 38, which is mounted on the carriage 26 and extends upwardly between the legs of the yoke 22, and a pinion 40 which is mounted on a shaft 41 that extends through the arms of a U-shape bracket 45. As will be seen, the bracket 45 is secured to the leg 24 of the yoke 22 and extends above the carriage 26 to provide a guide for the rack 38 which meshes with the pinion 40. A knob 48 on the outer end portion of the shaft is manually engageable for rotating the pinion 40 for raising or lowering the carriage 26 on the frame A. Thus the upper heat sink 32 may be moved into or out of engagement with the lid of a microelectronic package on the lower heat sink 14. To retain the carriage in fully raised position, as when not in use, a latch 50 is employed. The latch 50 includes a body 51 and a latch element 52, the body being secured to the upper surface of the carriage 26 near the forward edge thereof and the element 52, when in latched position, engaging the inner side edge of the leg 24 of the yoke 22.

Referring now generally to FIG. 1 and more specifically to FIGS. 4a, 4b and 5, a heater assembly is shown generally at 56. The heater assembly comprises basically an oblong rectangular heater core 58 having a rectangular aperture 60 whose dimensions are slightly smaller than those of a microelectronics package to be sealed. The core at the bottom edge of the aperture 60 is slightly recessed as shown at 63 to receive a lip on the package to be sealed. Formed in opposite longitudinal side walls 57 of core 58 are cylindrical recesses 61 and 62 within which are located heater elements 64 and 66, respectively. The heater elements are connected to a power supply, which is not shown, by conductors 70 and 71. Also within the heater core 58 is a thermocouple 68. The thermocouple is connected in a suitable electric circuit (not shown) for controlling the temperature of the heater assembly. The heater core 58 is made of chrome-plated brass in the preferred embodiment but may be formed of any material having a high specific heat. The heater core 58 is supported by a bracket 72 and heat isolating strips 74, 76 and 78, which isolating strips prevent heat produced by the heater core 58 from affecting other parts of the device. As best seen in FIG. 1, the bracket 72 is connected to a mounting sleeve 80 on the vertical bearing shaft 4 for mounting the heater assembly 56 for vertical and swinging movement on said shaft. A lever 83, pivotally mounted on the sleeve 80 by screw 84, has an integral cam 85 which is engageable with the foot plate 8. Movement of the lever in one direction or the other raises or permits lowering of the sleeve and thus the heater assembly. Similarly, the lever 83 may be manually engaged for swinging the heater assembly on the bearing shaft 4, clockwise movement of the assembly being limited by a stop 86.

Figure 6A:
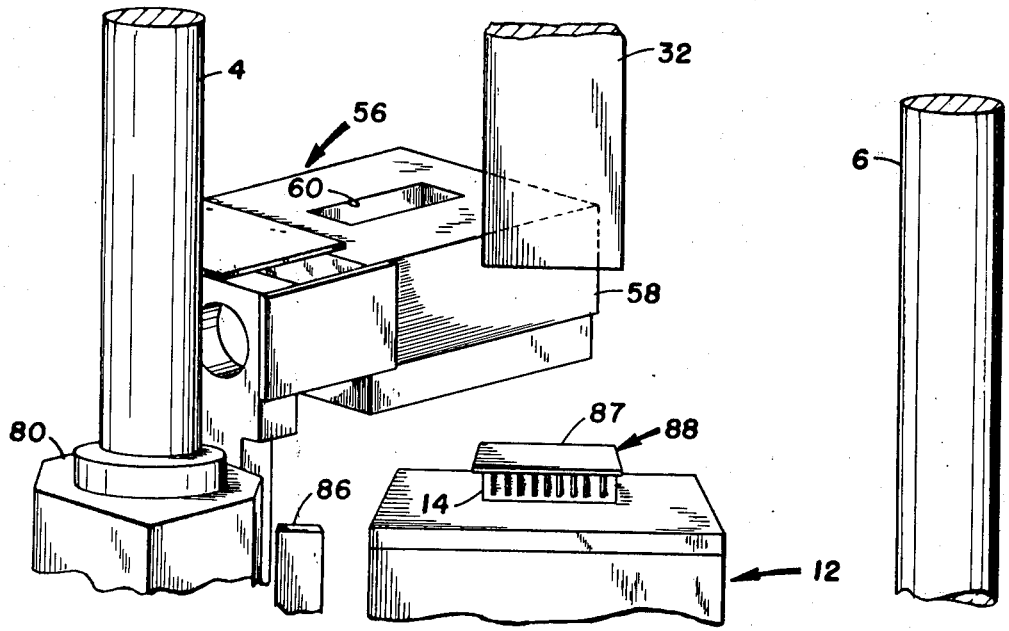
FIGS. 6a through 6g are detail perspectives showing a typical sequence of operation of the invention.
Figure 6B:
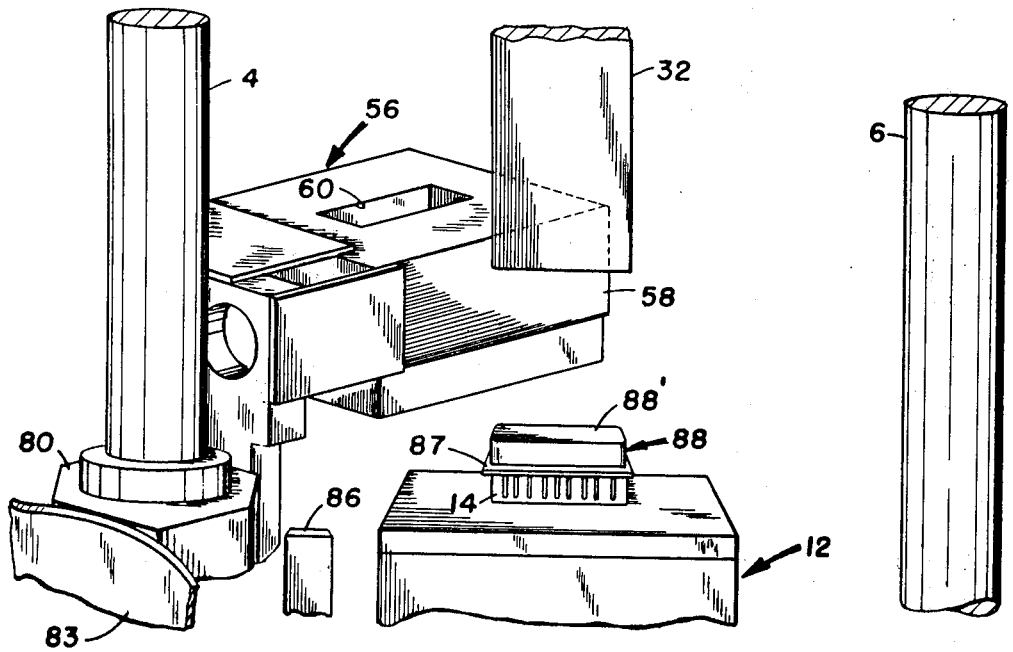
Figure 6C:
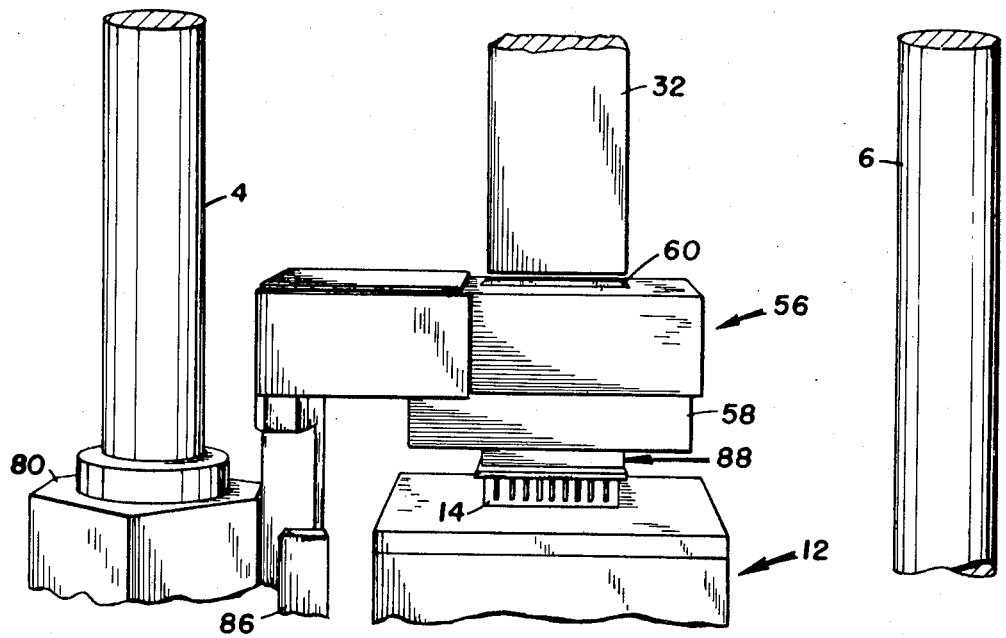
Figure 6D:
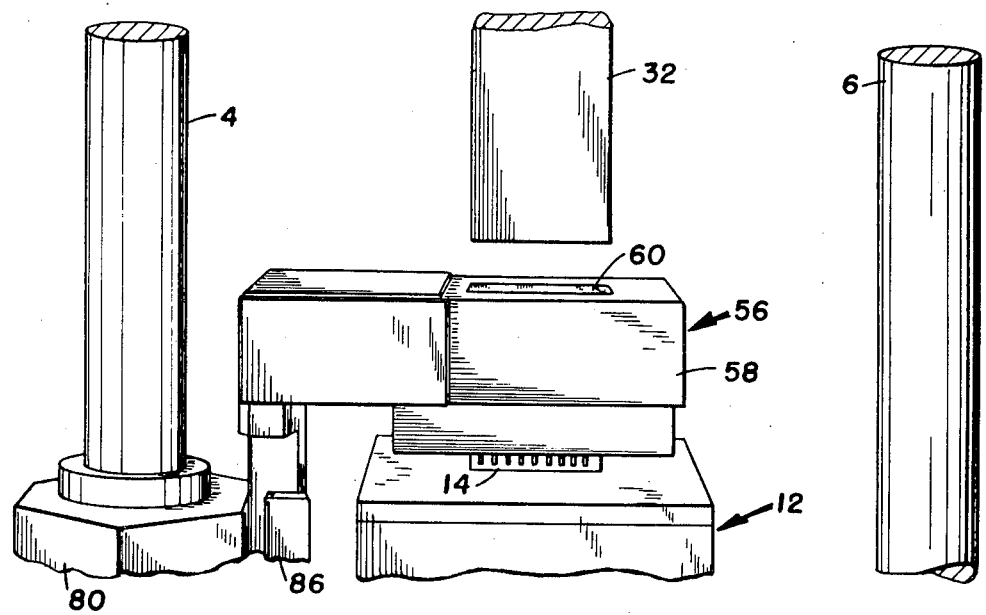
Figure 6E:
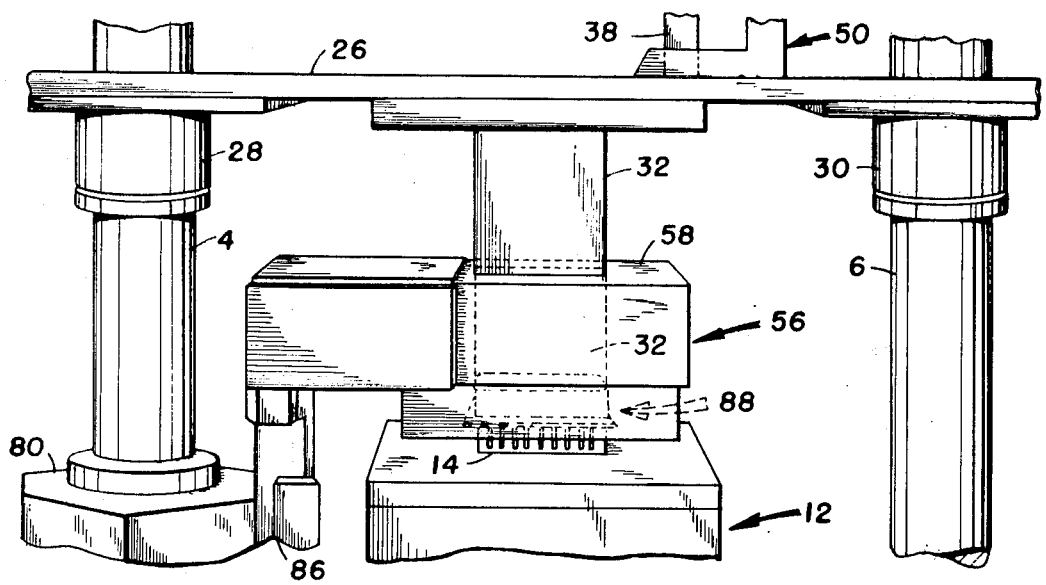
Figure 6F:
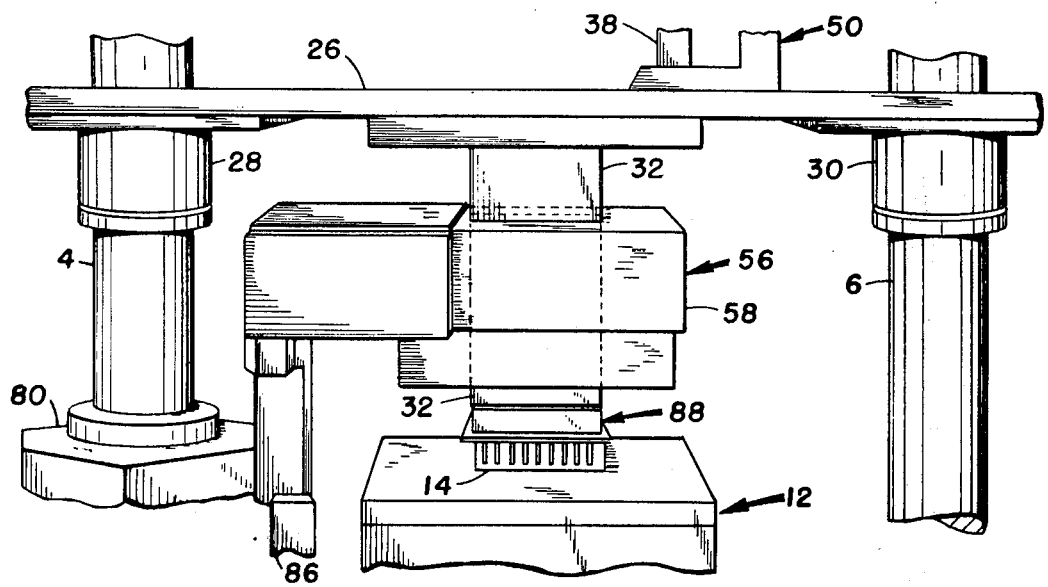
Figure 6G:
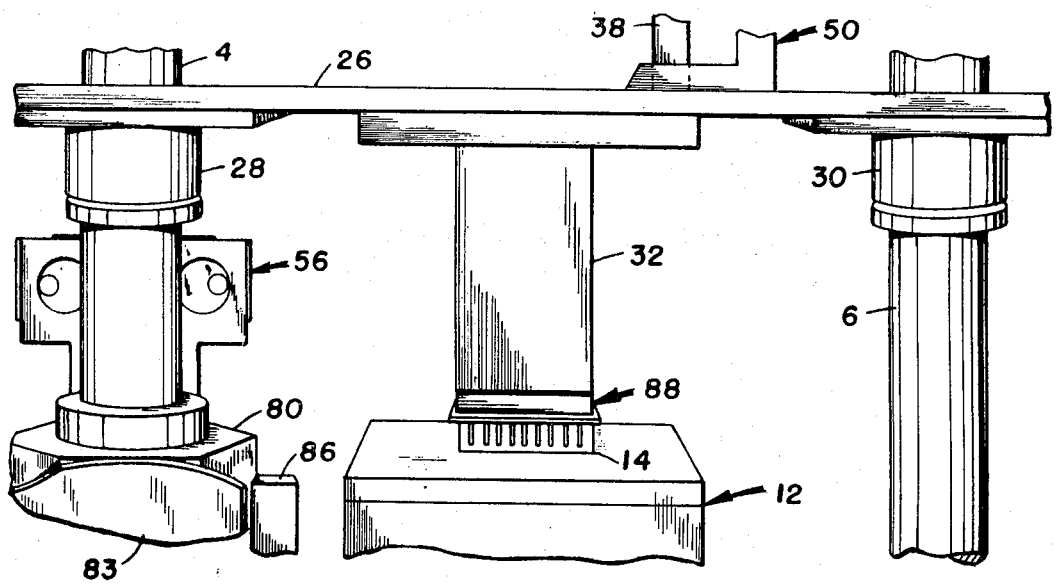

A better understanding of the operation of the present package sealer can be had by following the steps taken during the sealing of a microelectronics package. A typical sequence of operation is illustrated in FIGS. 6a through 6g and will be explained hereinafter. The first step in the sequence is to place the base platform 87 of a package to be sealed, shown at 88, on the lower heat sink 14, as shown in FIG. 6a. The lid of the package, shown at 88', is then placed on top of the base platform as shown in FIG. 6b. The underside of the rim of the lid is pretinned with solder so that when heat is applied the melting solder will flow between the base platform and the lid. After the lid is properly positioned, the heater core 58 is swung on the vertical bearing shaft 4, by the lever 83, until the aperture 60 thereof is located directly over the package, as is shown in FIG. 6c. The heater core is lowered into engagement with the periphery of the package, as shown in FIG. 6d, for melting the solder thereon. Since the timing parameters depend upon, inter alia, the size of the package, the parameters given hereinafter are for illustration purposes only and relate to a package having rectangular dimensions of 1 inch × ½ inch. The heater core 58 is usually applied to the package for approximately twenty seconds whereupon the upper heat sink 32 is lowered until it contacts the lid of the package, as shown in FIG. 6e. Heat is applied in this position for approximately ten more seconds, thereby giving a total heat exposure time of 30 seconds. At this time, the solder is sufficiently melted and the heater element is raised. This position is illustrated in FIG. 6f. The heater core is retained in place at this juncture so as to avoid the possibility of vibration which might interfere with the cooling of the solder. The position as illustrated in FIG. 6f is usually retained for approximately 10 seconds whereupon the upper heat sink 32 is quickly raised, the heater core 58 swung away, and the upper heat sink 32 again positioned on top of the sealed package, as shown in FIG. 6g, for approximately ten to fifteen seconds to enable the package to completely dissipate all heat. The upper heat sink 32 is raised at the end of this period, when the subject invention will appear as shown in FIG. 6b. The sealed package may be removed by raising the package release lever 20b, the total process taking only 45 to 50 seconds.

As will be obvious, the subject invention may be easily modified to perform a host of other related tasks. For example, the package sealer of the present invention can be used to remove package lids by reversing the basic sequence of operation.

By utilizing a heater core having a design as shown in FIGS. 7a and 7b, such core can be removed without requiring removal of the upper heat sink. In this embodiment the heater core is composed of companion sections 90 and 92 which are connected by a hinge 94. When the heating core has been applied to the package to be sealed for a length of time sufficient to melt the solder, the heating core sections are swung apart. Thus the package to be sealed is allowed to remain in continual physical contact with the upper and lower heat sinks.

Another heat sink and heater core modification is shown in FIG. 8. In this view a plurality of heat sinks 96, 98, 100 and 102, similar to the upper heat sink 32, is mounted on a common mandrel 103. A heater core 104 having apertures 105, 106, 107 and 108 to receive the heat sinks 96, 98, 100 and 102, respectively, forms a part of a heater assembly similar to the heater assembly 56. When in operative position the apertures 105, 106, 107 and 108 receive microelectronics packages mounted on lower heat sinks (not shown), as in the first described embodiment of the invention. As will be obvious, a plurality of packages can be sealed simultaneously by the use of this modification of the invention.

In the foregoing discussion it has been assumed that the means for actuating the various movable components of the subject invention have been by human manipulation. It would, of course, be obvious to automate the procedure discussed hereinabove by the proper utilization of a pre-programmed general purpose computer, thereby eliminating the necessity for manual control. Another obvious and possible embodiment of the subject invention would involve placing the invention in a sterile environment, evacuating the air present, and replacing it with a suitable gas.

Obviously, many modifications and variations of the present invention are possible in the light of the above teachings. It is therefore to be understood that within the scope of the appended claims the invention may be practiced otherwise than as specifically described.

I claim:

1. A method of sealing a pair of elements to each other to form a package, comprising the steps of:
    applying a meltable sealant to a portion of one of said elements;
    positioning one of said elements on a first heat sink;
    positioning the remaining element on the element positioned on the first heat sink;
    applying a heat source to the elements for causing said sealant to melt and flow between portions of the elements for connecting said elements in sealed relation;
    applying a second heat sink to the element not in contact with said first heat sink, thereby to remove heat from said elements during application to said elements of heat from the heat source and to cause a compressive force to be exerted on the elements to hold said elements together;
    displacing the heat source from proximity to the elements, thereby to discontinue the application of heat to the elements; and,
    continuously removing heat from the elements by means of the first and second heat sinks both during and after discontinuation of the application of heat to the elements.

2. The method of sealing a pair of elements to each other to form a package, comprising the steps of
    applying a coating of solder to a portion of a first element of said pair of elements,
    positioning a second element of said pair on a first heat sink,
    positioning said first element on said second element with said coating of solder confronting said second element,
    applying a heat source to said first element for causing said solder to melt and flow between portions of the elements for connecting said elements in sealed relation,
    applying a second heat sink to said first element during the heating step,
    removing heat from the first element to permit the solder to cool,
    removing the second heat sink from said first element,
    displacing the heat source from the proximity of the first element,
    and again applying the second heat sink to the first element to accelerate the cooling thereof.

3. The method recited in claim 1, including the additional step of demounting the package from the first heat sink.

* * * * *